US012673396B2

(12) United States Patent

Matsumoto et al.

(10) Patent No.: US 12,673,396 B2

(45) Date of Patent: Jul. 7, 2026

(54) CONSTANT-TEMPERATURE LIQUID SUPPLY APPARATUS

(71) Applicant: DISCO CORPORATION, Tokyo (JP)

(72) Inventors: Tadaomi Matsumoto, Tokyo (JP); Masaru Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 272 days.

(21) Appl. No.: 18/636,978

(22) Filed: Apr. 16, 2024

(65) Prior Publication Data

US 2024/0387210 A1 Nov. 21, 2024

(30) Foreign Application Priority Data

May 16, 2023 (JP) .................................. 2023-081005

(51) Int. Cl.
| | |
|---|---|
| B24B 55/03 | (2006.01) |
| B23Q 11/10 | (2006.01) |
| F24H 15/156 | (2022.01) |
| F24H 15/238 | (2022.01) |
| F24H 15/335 | (2022.01) |
| F24H 15/34 | (2022.01) |

(Continued)

(52) U.S. Cl.
CPC .............. B24B 55/03 (2013.01); B23Q 11/10 (2013.01); G05D 23/1951 (2013.01); H10P 72/0428 (2026.01); *F24H 15/156* (2022.01); *F24H 15/238* (2022.01); *F24H 15/335* (2022.01); *F24H 15/34* (2022.01)

(58) Field of Classification Search
CPC ..... B24B 55/02; B24B 55/03; H10P 72/0428;

G05D 23/1951; B23Q 11/10; B23Q 11/1084; B23Q 11/14; B23Q 11/146; F24H 15/156; F24H 15/238; F24H 15/335; F24H 15/34

USPC ...................................... 451/7, 60, 449, 450

See application file for complete search history.

(56) References Cited

U.S. PATENT DOCUMENTS 12,422,148 B1 * 9/2025 Chandler, Jr. ........ F24H 15/281

2010/0329650 A1 * 12/2010 Kim .................... F24D 19/1009

219/494

(Continued)

FOREIGN PATENT DOCUMENTS

JP 2020051716 A 4/2020

*Primary Examiner* — Brian D Keller

*Assistant Examiner* — Marcel T Dion

(74) *Attorney, Agent, or Firm* — GREER BURNS & CRAIN, LTD.

(57) ABSTRACT

A constant-temperature liquid supply apparatus includes a circulation route for circulating liquid between an inlet and an outlet connected to a processing apparatus, a tank that accommodates the liquid supplied through the inlet, a pump that discharges the liquid in the tank, a temperature adjusting unit that adjusts the temperature of the liquid, an outflow quantity measuring section that measures the flow rate of the liquid, a solenoid valve that controls whether the liquid should be circulated in the circulation route, and a controller. The controller switches from a normal mode of supplying the liquid to the processing apparatus to a stand-by mode of circulating the liquid in the circulation route, when the flow rate is zero, and the discharge quantity from the pump is smaller than that in the normal mode, to thereby lower the power consumption of the pump in the stand-by mode.

4 Claims, 5 Drawing Sheets

(51) Int. Cl.
    *G05D 23/19*         (2006.01)
    *H10P 72/00*        (2026.01)

(56)                References Cited

U.S. PATENT DOCUMENTS

2013/0034344 A1 *   2/2013   Lutz ..................... F24H 15/486
                                            392/449
2017/0341198 A1 * 11/2017   Matsumoto .......... B23Q 11/141
2022/0205684 A1 *   6/2022   Tatsumi ................ F24H 15/238

* cited by examiner

START (IV)

401 IS FLOW RATE ZERO ? — No

Yes

402 HAS PREDETERMINED LENGTH OF TIME BEEN EXCEEDED ? — No

Yes 403

REDUCE DISCHARGE QUANTITY ; STOP OPERATION

RETURN

START

501 IS FLOW RATE ZERO ? — No

502 TO NORMAL MODE (IV)

Yes

503 HAS PREDETERMINED THRESHOLD EXCEEDED ? — No

Yes 504

INCREASE DISCHARGE QUANTITY ; OPERATION

RETURN

CONSTANT-TEMPERATURE LIQUID SUPPLY APPARATUS

BACKGROUND OF THE INVENTION

Field of the Invention

The present invention relates to a constant-temperature liquid supply apparatus for supplying liquid from a liquid supply source to a processing apparatus while adjusting the liquid to a constant temperature.

Description of the Related Art

In general, in a processing apparatus such as a grinding apparatus and a cutting apparatus, the water temperatures of processing water, cooling water for a spindle, and the like are controlled to constant temperatures. By the supply of the processing water and the cooling water at the constant temperatures, worsening of processing accuracy due to thermal expansion or thermal shrinkage of mechanical parts and damaging of the apparatus itself due to mutual contact of parts, such as seizure of the spindle, are prevented.

Hitherto, there has been known a constant-temperature water supply apparatus for maintaining, at a constant temperature, water supplied to a processing apparatus (see, for example, Japanese Patent Laid-open No. 2020-051716).

The constant-temperature water supply apparatus disclosed in Japanese Patent Laid-open No. 2020-051716 is configured such that water supplied from plant equipment or the like is reserved in a tank and the water is supplied to the processing apparatus while being adjusted to the constant temperature by temperature adjusting means disposed in a channel through which the water in the tank is fed to the processing apparatus by a pump. In addition, for appropriately supplying a quantity of water necessary on the processing apparatus side, the channel of the constant-temperature water supply apparatus is piped in such a manner that water can be circulated in the inside thereof, and the water in the circulation piping is adjusted to the constant temperature. Further, the quantity of water necessary on the processing apparatus side is supplied from the circulation piping.

SUMMARY OF THE INVENTION

However, in the constant-temperature water supply apparatus disclosed in Japanese Patent Laid-open No. 2020-051716, the water in the circulation piping is circulated while being maintained at the constant temperature such that the water at the constant temperature can be supplied any time, that is, even when the processing apparatus is out of use. Thus, the constant-temperature water supply apparatus disclosed in Japanese Patent Laid-open No. 2020-051716 has such a problem that power consumption of the constant-temperature water supply apparatus is increased due to the operations of the pump and the temperature adjusting means.

Hence, there is such a problem that, in the constant-temperature water supply apparatus for supplying water to a processing apparatus while adjusting the water to a constant temperature, the power consumption of the constant-temperature water supply apparatus should be suppressed when the processing apparatus is not in operation.

Accordingly, it is an object of the present invention to provide a constant-temperature liquid supply apparatus that is able to suppress power consumption.

In accordance with an aspect of the present invention, there is provided a constant-temperature liquid supply apparatus for supplying liquid from a liquid supply source to a processing apparatus while adjusting the liquid to a constant temperature, the constant-temperature liquid supply apparatus including a housing, an inlet disposed in the housing such that the liquid is allowed to flow from the liquid supply source into the housing, an outlet disposed in the housing such that the liquid is allowed flow out of the housing to the processing machine, a circulation route for circulating the liquid between the inlet and the outlet, a tank that is disposed in the circulation route and accommodates the liquid flowing in through the inlet, a pump that is disposed adjacent to the tank in the circulation route and discharges the liquid accommodated in the tank, a temperature adjusting unit that is disposed in the circulation route and adjusts the temperature of the liquid, an outflow quantity measuring section that measures the outflow quantity of the liquid flowing out through the outlet, an on-off valve that is disposed in the circulation route and controls whether the liquid should be circulated in the circulation route, and a controller that controls at least the pump and the temperature adjusting unit, in which the controller has a first determination section that determines switching from a normal mode of supplying the liquid to the processing apparatus to a stand-by mode of circulating the liquid in the circulation route by controlling the on-off valve, when it is determined that the outflow quantity of the liquid measured by the outflow quantity measuring section is zero, and, in the stand-by mode, the discharge quantity from the pump is set to be smaller than that in the normal mode to thereby lower the power consumption of the pump.

Preferably, the controller stops the operation of the temperature adjusting unit to thereby lower the power consumption of the temperature adjusting unit, in the stand-by mode.

Preferably, the controller has a timer, and the first determination section measures a length of continuation time for which the outflow quantity of the liquid measured by the outflow quantity measuring section is zero by the timer, and, when the length of continuation time exceeds a predetermined length of time, the first determination section determines that the outflow quantity of the liquid is zero, and the controller switches from the normal mode to the stand-by mode.

Preferably, the constant-temperature liquid supply apparatus further includes a thermometer that is disposed on a downstream side of the temperature adjusting unit and measures the temperature of the liquid, and the controller has a second determination section that determines to switch the discharge quantity from the pump to a discharge quantity in the normal mode and operate the temperature adjusting unit, when the temperature measured by the thermometer exceeds a predetermined temperature during the stand-by mode.

The present invention produces such an effect that the power consumption of the constant-temperature liquid supply apparatus can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not to be limited by the contents described in the following embodiment. In addition, the constituent elements described below include those which can easily be conceived of by a person skilled in the art and those which are substantially the same. Further, the configurations described below can be combined with one another as required. Besides, various kinds of omission, replacement, or modification of the configuration can be made within such ranges as not to depart from the gist of the present invention.

Figure 1:
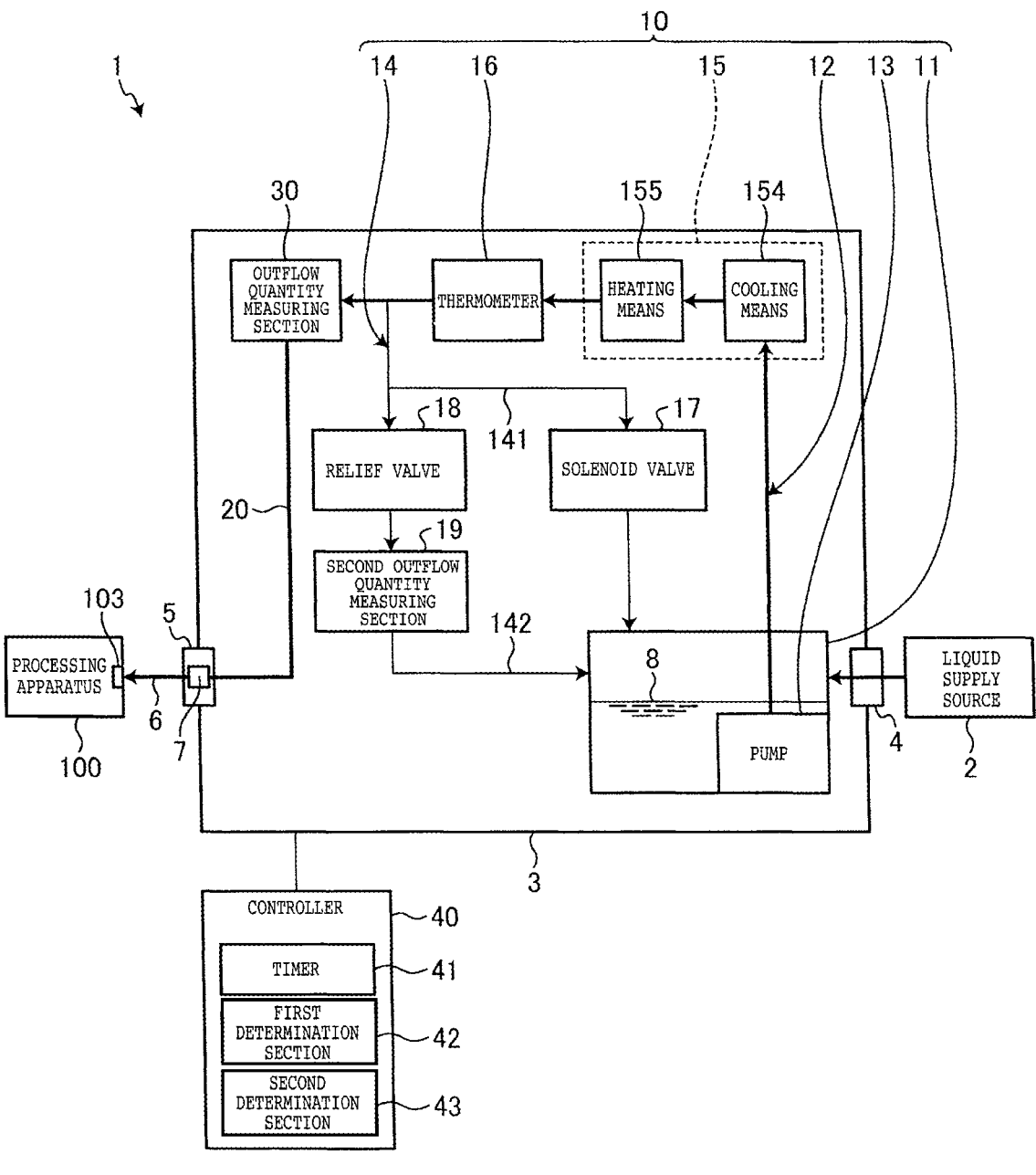
FIG. 1 is a block diagram that schematically depicts a configuration example of a constant-temperature liquid supply apparatus according to an embodiment.
Figure 2:
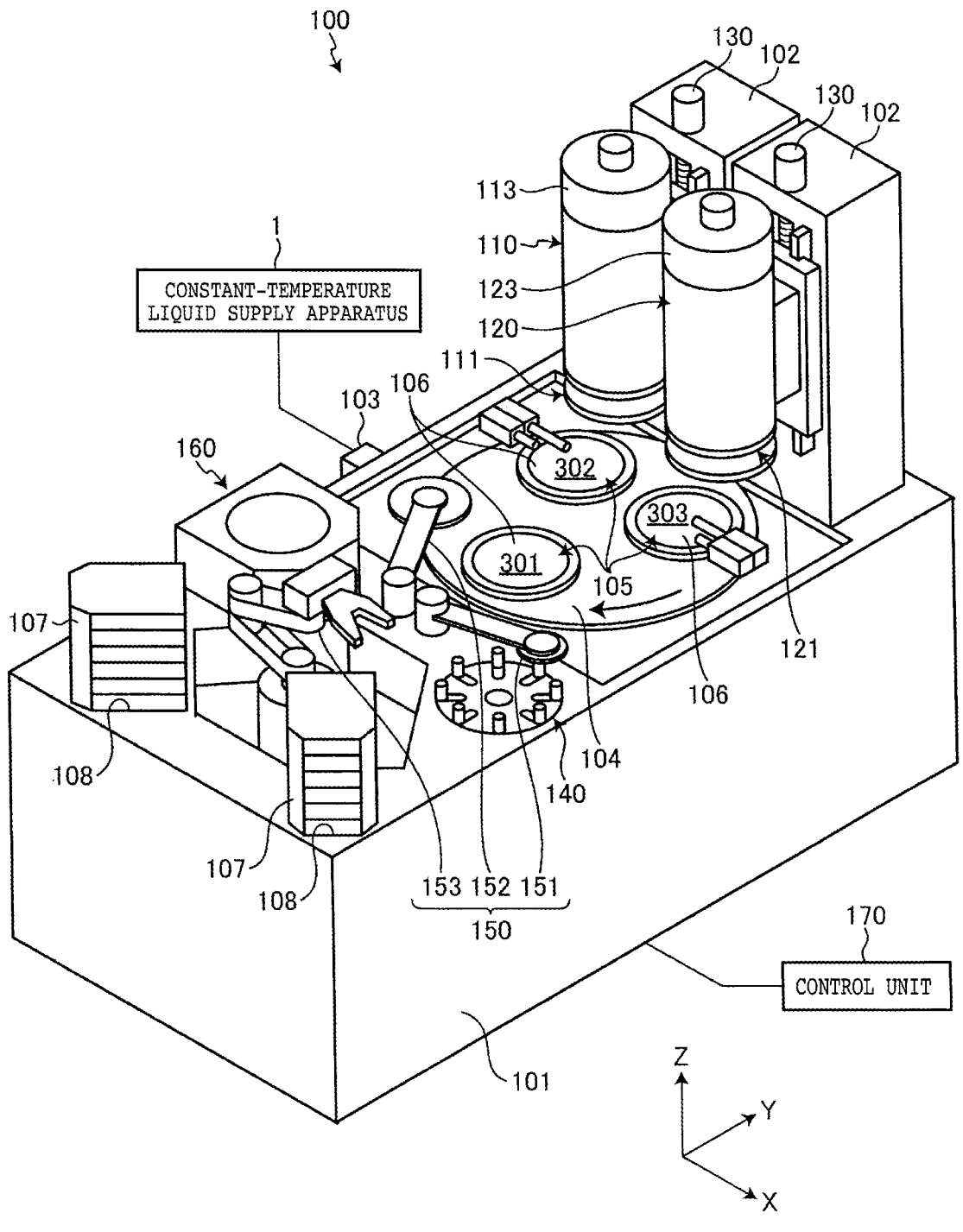
FIG. 2 is a perspective view that schematically depicts a configuration example of a processing apparatus for which the constant-temperature liquid supply apparatus depicted in FIG. 1 is used.
Figure 3:
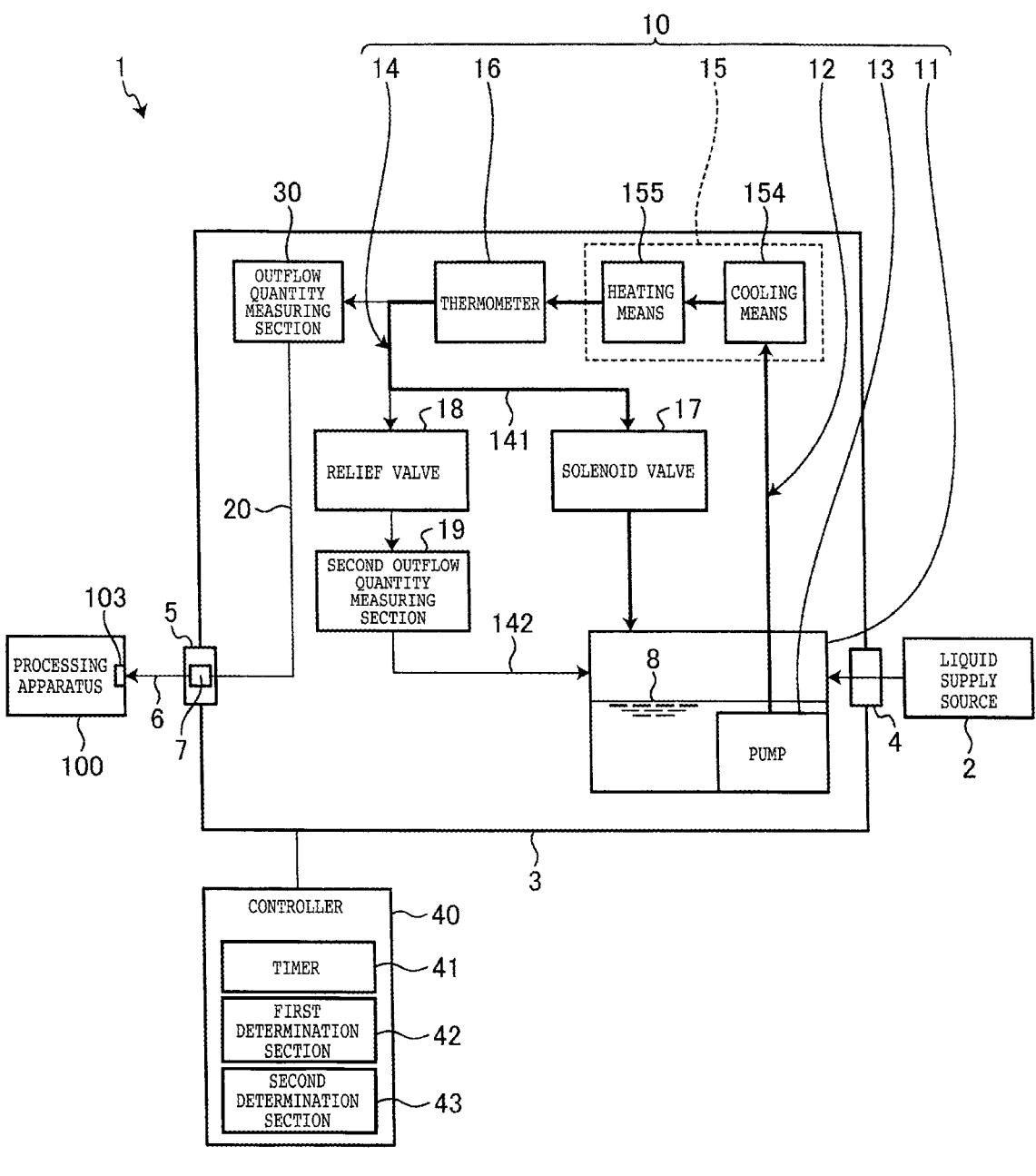
FIG. 3 is a block diagram that schematically depicts a case where the constant-temperature liquid supply apparatus depicted in FIG. 1 is in a stand-by mode.

A constant-temperature liquid supply apparatus according to the embodiment of the present invention will be described with reference to the drawings. FIG. 1 is a block diagram schematically depicting a configuration example of the constant-temperature liquid supply apparatus according to the embodiment. FIG. 2 is a perspective view schematically depicting a configuration example of a processing apparatus for which the constant-temperature liquid supply apparatus depicted in FIG. 1 is used. FIG. 3 is a block diagram schematically depicting a case where the constant-temperature liquid supply apparatus depicted in FIG. 1 is in a stand-by mode.

A constant-temperature liquid supply apparatus 1 depicted in FIG. 1 according to the embodiment is an apparatus that supplies liquid 8 at a constant temperature to a processing apparatus 100 depicted in FIG. 2. Note that the liquid 8 at the constant temperature which the constant-temperature liquid supply apparatus 1 supplies is liquid 8 to be supplied to a workpiece or the like at the time of processing the workpiece by the processing apparatus 100 depicted in FIG. 2, and, in the embodiment, the liquid 8 is pure water and is not used for cooling a spindle or the like. Note that, in the present invention, the liquid 8 may be city water. In addition, the liquid 8 at the constant temperature means liquid 8 at a temperature of not lower than a predetermined lower limit temperature but not higher than a predetermined upper limit temperature (a temperature higher than the lower limit temperature).

The processing apparatus 100 depicted in FIG. 2 is a grinding apparatus that grinds a workpiece. The workpiece to be processed by the processing apparatus 100 depicted in FIG. 2 is such a wafer as a circular plate-shaped semiconductor wafer or optical device wafer having a substrate formed of silicon, sapphire, gallium, or the like. The workpiece is formed with unillustrated devices in regions partitioned by streets set in a grid pattern on a front surface of the substrate.

The devices are, for example, integrated circuit devices such as integrated circuits (ICs), or large scale integration (LSI) circuits, image sensors such as charge coupled devices (CCDs) or complementary metal oxide semiconductors (CMOSs), micro electro mechanical systems (MEMS), or semiconductor memories (storage devices).

In addition, in the embodiment, the workpiece has its back surface on the back side of the front surface ground by the processing apparatus 100 to be thinned to a predetermined finished thickness, and is thereafter divided along the streets into the individual device chips.

As depicted in FIG. 2, the processing apparatus 100 includes an apparatus base 101, a turntable 104, a plurality of (in the embodiment, three) holding tables 105 disposed on the turntable 104, a rough grinding unit 110, a finish grinding unit 120, a grinding feeding unit 130, a cassette 107, an alignment unit 140 which is a support unit, a conveying unit 150, a cleaning unit 160, and a control unit 170.

The turntable 104 is a disk-shaped table provided on an upper surface of the apparatus base 101, is provided to be rotatable in a horizontal plane around an axis parallel to a Z-axis direction, and is driven to rotate at a predetermined timing. Note that the Z-axis direction is a direction parallel to the vertical direction. On the turntable 104, for example, three holding tables 105 are disposed at regular intervals of, for example, phase angles of 120 degrees.

As depicted in FIG. 2, these three holding tables 105 are each formed in the shape of a circular plate, and its upper surface is a holding surface 106 configured by a porous material such as porous ceramic. The holding table 105 is a table of a vacuum chuck table structure in which the holding surface 106 includes a vacuum chuck connected with an unillustrated suction source, and, with the front surface side of the workpiece mounted on the holding surface 106 and with the holding surface 106 sucked by the suction source, the workpiece is held under suction on the holding surface 106.

In addition, at the time of grinding, the holding table 105 is driven to rotate around an axis parallel to the Z-axis direction by an unillustrated rotating mechanism. By rotation of the turntable 104, the holding tables 105 are each sequentially moved into a conveying-in/out region 301, a rough grinding region 302, a finish grinding region 303, and the conveying-in/out region 301.

Note that the conveying-in/out region 301 is a region where the workpiece is conveyed onto the holding table 105 or conveyed out of the holding table 105, the rough grinding region 302 is a region where the workpiece held by the holding table 105 is subjected to rough grinding (corresponding to grinding) by the rough grinding unit 110, and the finish grinding region 303 is a region where the workpiece held by the holding table 105 is subjected to finish grinding (corresponding to grinding) by the finish grinding unit 120.

The rough grinding unit 110 is a processing unit having mounted thereto a grinding wheel 111 (corresponding to a processing tool) for rough grinding in which rough-grinding grindstones for rough grinding of the back surface, exposed to the upper side, of the workpiece held by the holding table 105 are disposed in an annular pattern, whereby the back surface of the workpiece held by the holding surface 106 of the holding table 105 in the rough grinding region 302 is subjected to rough grinding. The finish grinding unit 120 is a processing unit having mounted thereto a grinding wheel 121 (corresponding to a processing tool) for finish grinding in which finish-grinding grindstones for finish grinding of the back surface of the workpiece held by the holding table 105 are disposed in an annular pattern, whereby the back surface of the workpiece held by the holding surface 106 of the holding table 105 in the finish grinding region 303 is subjected to finish grinding.

The grinding units 110 and 112 have grinding wheels 111 and 121 mounted to lower ends (corresponding to tips) of spindles rotated around axes parallel to the Z-axis direction by motors 113 and 123, and have the grindstones of the grinding wheels 111 and 121 disposed opposite to the holding surfaces 106 of the holding tables 105. The grinding unit 110 or 120 is so configured that, while the spindle and the grinding wheel 111 or 121 are rotated around the axes by the motor 113 or 123 and while the liquid 8 supplied from the constant-temperature liquid supply apparatus 1 is supplied to the back surface of the workpieces held by the holding table 105 in the grinding region 302 or 303, the grindstones of the grinding wheel 111 or 121 are brought closer to the holding table 105 at a predetermined feed rate by the grinding feeding unit 130, whereby the back surface of the workpiece is subjected to rough grinding or finish grinding.

The grinding feeding unit 130 moves the grinding unit 110 or 120 in the Z-axis direction, to thereby move the grinding unit 110 or 120 and the holding table 105 relatively toward or away from each other. In the embodiment, the grinding feeding unit 130 is provided on an erected column 102 erected from one end part in a Y-axis direction parallel to the horizontal direction of the apparatus base 101. The grinding feeding unit 130 includes a known ball screw provided to be rotatable around an axis, a known motor for rotating the ball screw around the axis, and known guide rails for supporting a spindle housing 115 or 125 of each grinding unit 110 or 120 in such a manner as to be movable in the Z-axis direction.

Note that, in the embodiment, the rough grinding unit 110 and the finish grinding unit 120 are configured such that the axes as centers of rotation of the grinding wheels 111 and 121 and the axes as centers of rotation of the holding tables 105 are disposed in parallel to each other with horizontal intervals therebetween, and that the grindstones pass on the centers of the back surfaces of the workpieces held by the holding tables 105.

The cassette 107 is an accommodating container that has a plurality of slots for accommodating a plurality of workpieces. The cassette 107 accommodates a plurality of workpieces that have or have not yet been subjected to grinding. A pair of cassettes 107 are provided, and are respectively disposed on cassette mounting stands 108. The alignment unit 140 is a table on which the workpiece taken out of the cassette 107 is temporarily placed in order to perform alignment of centers.

The conveying unit 150 is a unit for conveying the workpiece. The conveying unit 150 includes a conveying-in unit 151, a conveying-out unit 152, and a conveying-in/out unit 153.

The conveying-in unit 151 is formed in the shape of an arm that has at a tip part thereof a suction pad for holding the workpiece under suction, and that is provided on the apparatus base 101 in such a manner as to be swingable around a base end part thereof. The conveying-in unit 151 holds the workpiece that has been aligned by the alignment unit 140 but has not yet been subjected to grinding on the suction pad under suction and conveys in the workpiece onto the holding table 105 located in the conveying-in/out region 301.

The conveying-out unit 152 is formed in the shape of an arm that has at a tip part thereof a suction pad for holding the workpiece under suction, and that is provided on the apparatus base 101 in such a manner as to be swingable around a base end part thereof. The conveying-out unit 152 holds the workpiece that is placed on the holding table 105 located on the conveying-in/out region 301 and that has been subjected to grinding on the suction pad under suction and conveys out the workpiece to the cleaning unit 160.

The conveying-in/out unit 153 takes out the workpiece that has not yet been subjected to grinding from the cassette 107 and conveys the workpiece to the alignment unit 140, and also takes out the workpiece that has been subjected to grinding from the cleaning unit 160 and conveys the workpiece to the cassette 107. The conveying-in/out unit 153 is, for example, a robot pick including a U-shaped hand, and holds under suction and conveys the workpiece by a U-shaped hand.

The cleaning unit 160 cleans the workpiece that has been subjected to grinding, to remove contaminants such as swarf deposited on the ground back surface of the workpiece.

The control unit 170 is a unit for controlling the above-mentioned constituent units of the processing apparatus 100. In other words, the control unit 170 controls operations of at least the holding tables 105 and the grinding units 110 and 120 to cause the processing apparatus 100 to perform a processing operation on the workpiece. The control unit 170 is a computer that includes an arithmetic processing device having a microprocessor such as a central processing unit (CPU), a storage device having a memory such as a read only memory (ROM) or a random access memory (RAM), and an input/output interface device.

The arithmetic processing device of the control unit 170 performs arithmetic processing according to a computer program stored in the storage device, and outputs control signals for controlling the processing apparatus 100 to the above-mentioned constituent elements of the processing apparatus 100 through the input/output interface device. In addition, the control unit 170 is connected to a display unit configured by a liquid crystal display or the like for displaying the status of the processing operation, images, and the like, to an input unit used when the operator registers information concerning the contents of processing, and to an alarm unit that issues an alarm to the operator.

The input unit is configured by at least one of a touch panel provided in the display unit or a keyboard or the like. The alarm unit issues at least one of a sound, light, or a message on the touch panel to issue an alarm to the operator.

In addition, in the embodiment, the processing apparatus 100 includes an on-off valve 103 provided at a supply port through which the liquid 8 is supplied from the constant-temperature liquid supply apparatus 1. At the time of grinding the workpiece, the processing apparatus 100 opens the on-off valve 103, whereby the liquid 8 is supplied from the constant-temperature liquid supply apparatus 1, and the thus supplied liquid 8 is supplied to the back surfaces of the workpieces held by the holding tables 105 located in the grinding regions 302 and 303 during grinding. Besides, when the grinding of the workpiece is stopped, the processing apparatus 100 closes the on-off valve 103, whereby the supply of the liquid 8 from the constant-temperature liquid supply apparatus 1 is stopped.

In the embodiment, the processing apparatus 100 is operated such that the cassette 107 accommodating the workpieces with their back surfaces directed upward is placed on the cassette mounting stand 108 of the apparatus base 101 by an operator, processing conditions are registered in the control unit 170, and the control unit 170 accepts a direction to start a processing operation from the operator, whereon the processing operation is started. In the processing operation, the processing apparatus 100 is operated such that the control unit 170 rotates the spindles of the grinding units 110 and 120 around the axes at rotational speeds determined by the processing conditions, causes the conveying-in/out unit 153 to take out one workpiece from one of the cassettes 107, to convey in the workpiece to the alignment unit 140, causes the alignment unit 140 to perform alignment of the center of the workpiece, and causes the conveying-in unit 151 to support and convey the workpiece onto the holding surface 106 of the holding table 105 located in the conveying-in/out region 301.

In the processing operation, the processing apparatus 100 is operated such that the control unit 170 causes the workpiece to be held under suction on the holding surface 106 of the holding table 105 located in the conveying-in/out region 301, rotates the turntable 104, causes the holding table 105 holding the workpiece thereon in the conveying-in/out region 301 to be sequentially moved to the rough grinding region 302 and the finish grinding region 303, supplies the liquid 8 while rotating the holding table 105 around the axis, and subjects the workpiece to grinding sequentially by the rough grinding unit 110 and the finish grinding unit 120. In the processing operation, the processing apparatus 100 is operated such that the control unit 170 subjects the workpiece to finish grinding, thereafter rotates the turntable 104, to cause the holding table 105 holding the workpiece that has been subjected to finish grinding to be moved into the conveying-in/out region 301, causes the conveying-out unit 152 to convey the workpiece having been subjected to finish grinding from the holding table 105 located in the conveying-in/out region 301 to the cleaning unit 160, cleans the workpiece by the cleaning unit 160, and thereafter accommodates the workpiece into the cassette 107 of the conveying-in/out unit 153.

In the processing operation, the processing apparatus 100 is operated such that, each time the control unit 170 rotates the turntable 104 by 120 degrees, the workpiece that has been subjected to finish grinding is conveyed from the holding table 105 located in the conveying-in/out region 301 and holding the workpiece to the cleaning unit 160, the workpiece that has not yet been subjected to grinding is conveyed onto the holding table 105 located in the conveying-in/out region 301 and not holding the workpiece having been subjected to finish grinding, the workpiece that is held by the holding table 105 located in the rough grinding region 302 and that has not yet been ground is subjected to rough grinding, and the workpiece that is held by the holding table 105 located in the finish grinding region 303 and that has been subjected to rough grinding is subjected to finish grinding. In this way, the processing apparatus 100 is operated such that, each time the control unit 170 rotates the turntable 104 by 120 degrees, the workpiece is conveyed onto or out of the holding table 105 located in the conveying-in/out region 301, the workpiece held on the holding surface 106 of the holding table 105 is sequentially positioned in the rough grinding region 302 and the finish grinding region 303, and the workpiece is sequentially subjected to rough grinding and finish grinding. The processing apparatus 100 ends the processing operation when the control unit 170 has subjected all the workpieces in the cassette 107 to rough grinding and finish grinding.

Figure 4:
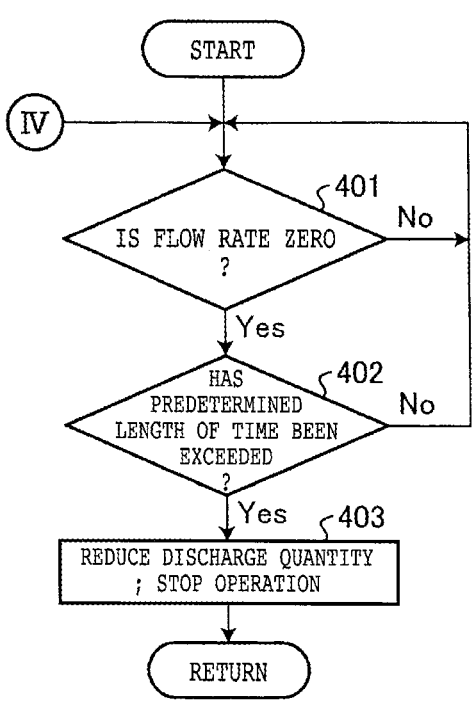
FIG. 4 is a flow chart of an operation repeatedly carried out during a normal mode by a controller of the constant-temperature liquid supply apparatus depicted in FIG. 1.
Figure 5:
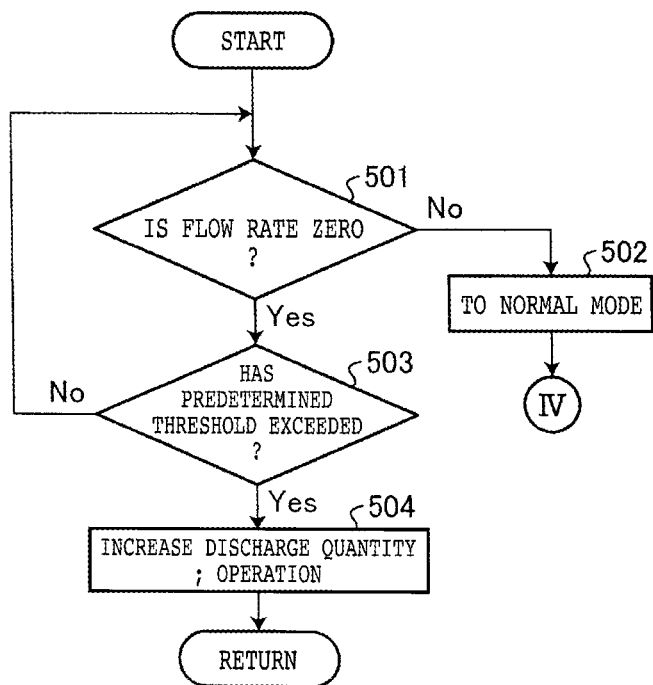
FIG. 5 is a flow chart of an operation repeatedly carried out in the stand-by mode by the controller of the constant-temperature liquid supply apparatus depicted in FIG. 1.
Figure 6:
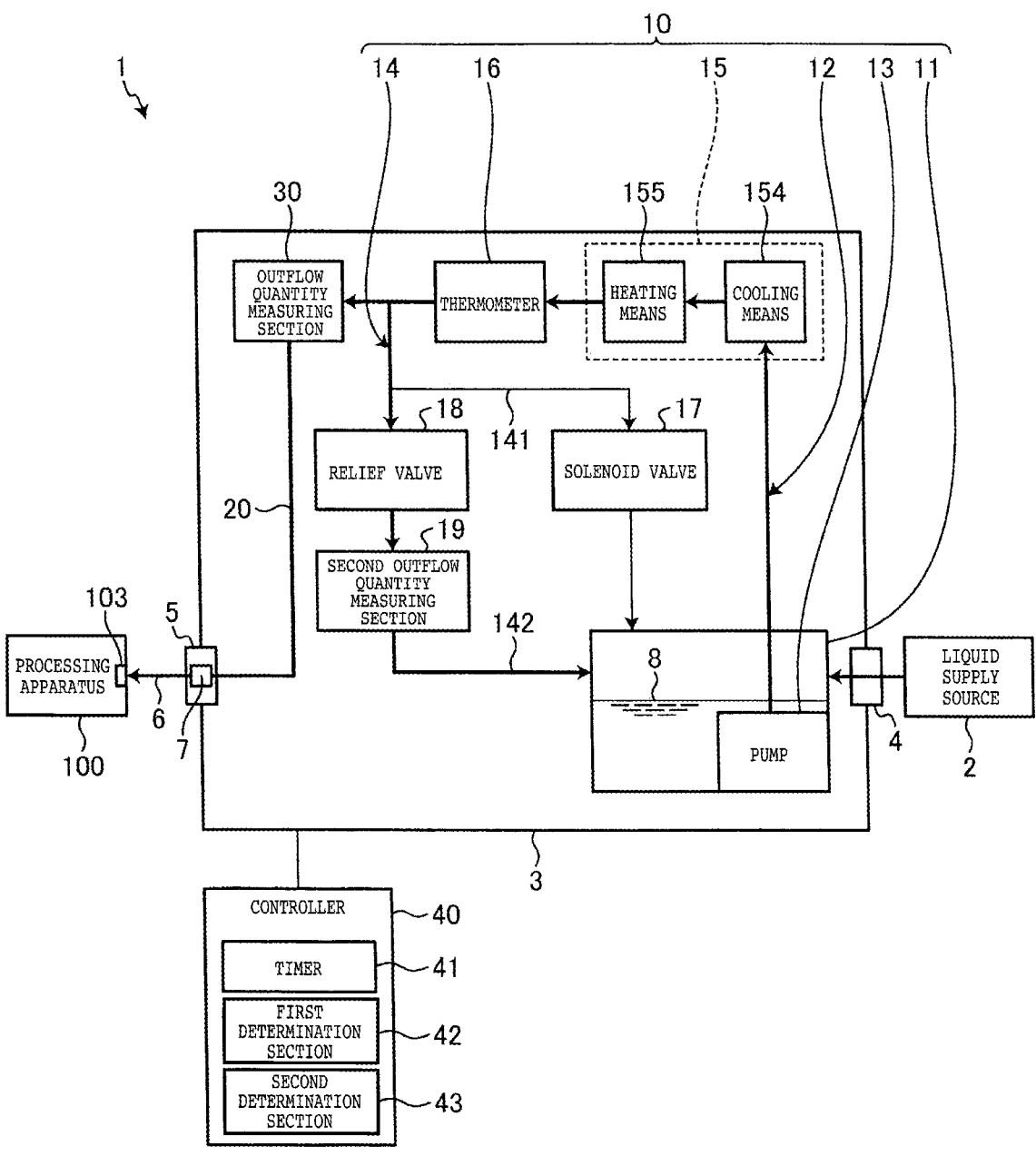
FIG. 6 is a block diagram that schematically depicts the flow of the liquid when the constant-temperature liquid supply apparatus depicted in FIG. 1 supplies the liquid to a processing apparatus of a modification example.

Next, the constant-temperature liquid supply apparatus 1 will be described. FIG. 4 is a flow chart of an operation carried out repeatedly in the normal mode by a controller of the constant-temperature liquid supply apparatus depicted in FIG. 1. FIG. 5 is a flow chart of an operation carried out repeatedly in the stand-by mode by the controller of the constant-temperature liquid supply apparatus depicted in FIG. 1. FIG. 6 is a block diagram schematically depicting the flow of the liquid when the liquid is supplied to a processing apparatus of a modification example by the constant-temperature liquid supply apparatus depicted in FIG. 1.

The constant-temperature liquid supply apparatus 1 is an apparatus that adjusts the temperature of the liquid 8 supplied from a liquid supply source 2 depicted in FIG. 1 to the above-described constant temperature and supplies the liquid 8 to the processing apparatus 100. As depicted in FIG. 1, the constant-temperature liquid supply apparatus 1 includes a casing 3, an inlet 4 provided in the casing 3, an outlet 5 provided in the casing 3, a circulation route 10 accommodated in the casing 3, a discharge route 20 accommodated in the casing 3, an outflow quantity measuring section 30, and a controller 40.

The inlet 4 is provided for inflow of the liquid 8 from the liquid supply source 2. The outlet 5 is provided for outflow of the liquid 8 to the processing apparatus 100. The outlet 5 is connected to the on-off valve 103 of the processing apparatus 100 through piping 6. In addition, in the embodiment, an outlet solenoid valve 7 which is an on-off valve is provided at the outlet 5. The outlet solenoid valve 7 permits outflow of the liquid 8 to the processing apparatus 100 when opened, and restricts the outflow of the liquid 8 to the processing apparatus 100 when closed.

The circulation route 10 is provided for circulation of the liquid 8 between the inlet 4 and the outlet 5. The circulation route 10 includes a tank 11, a supply channel 12, a pump 13, a circulation channel 14, a temperature adjusting unit 15, and a thermometer 16. The tank 11 is disposed in the circulation route 10, and accommodates the liquid 8 flowing in via the inlet 4. The tank 11 and the inlet 4 are connected with each other, and the liquid 8 is supplied from the liquid supply source 2 through the inlet 4. The tank 11 temporarily reserves the liquid 8 supplied from the liquid supply source 2.

The supply channel 12 has one end thereof connected to the tank 11, and is supplied with the liquid 8 in the tank 11. The pump 13 is disposed adjacent to the tank 11 in the circulation route 10, and discharges the liquid 8 in the tank 11 into the supply channel 12. In the embodiment, the pump 13 discharges the liquid 8 at a first flow rate (in the embodiment, 25 L/min) into the supply channel 12 when driven at 60 Hz, and discharges the liquid 8 at a second flow rate (lower than the first flow rate; in the embodiment, 12.5 L/min) into the supply channel 12 when driven at 30 Hz.

The circulation channel 14 has its one end connected to the other end of the supply channel 12, is branched at its center into two branch channels 141 and 142, which are connected to the tank 11, and returns the liquid 8 in the supply channel 12 to the tank 11.

In addition, the circulation route 10 includes a solenoid valve 17 which is an on-off valve, a relief valve 18, and a second outflow quantity measuring section 19. The solenoid valve 17 is disposed in the circulation route 10, and controls whether the liquid 8 should be circulated into the circulation route 10. In the embodiment, the solenoid valve 17 is provided in the branch channel 141 which is one of the two branch channels 141 and 142, permits the liquid 8 from the supply channel 12 to return to the tank 11 through the one branch channel 141 when opened, and restricts the returning of the liquid 8 from the supply channel 12 to the tank 11 through the one branch channel 141 when closed.

The solenoid valve 17 returns the liquid 8 from the supply channel 12 to the tank 11 through the one branch channel 141 by opening the one branch channel 141, to thereby circulate the liquid 8 in the tank 11 between the supply channel 12 and the circulation channel 14 of the circulation route 10. The solenoid valve 17 restricts the returning of the liquid 8 from the supply channel 12 to the tank 11 through the one branch channel 141 by closing the one branch channel 141, to thereby restrict the circulation of the liquid 8 in the tank 11 between the supply channel 12 and the circulation channel 14 of the circulation route 10. In this way, the solenoid valve 17 performs control as to whether to circulate the liquid 8 into the circulation route 10 by opening and closing the one branch channel 141.

The relief valve 18 is disposed in the branch channel 142 that is the other one of the two branch channels 141 and 142, and permits the liquid 8 from the supply channel 12 to return to the tank 11 through the other branch channel 142 by opening the other branch channel 142 when the liquid 8 in the other branch channel 142 reaches or exceeds a set pressure. The relief valve 18 restricts the returning of the liquid 8 from the supply channel 12 to the tank 11 through the other branch channel 142 by closing itself when the liquid 8 in the other branch channel 142 is less than the set pressure. The second outflow quantity measuring section 19 measures the flow rate of the liquid 8 flowing in the other branch channel 142, and outputs the measurement result to the controller 40.

The temperature adjusting unit 15 is disposed in the circulation route 10, and adjusts the temperature of the liquid 8. In the embodiment, the temperature adjusting unit 15 is disposed in the supply channel 12 of the circulation route 10, and adjusts the temperature of the liquid 8 flowing in the supply channel 12. The temperature adjusting unit 15 includes cooling means 154 and heating means 155. The cooling means 154 cools the liquid 8 flowing in the supply channel 12 when driven, but does not cool the liquid 8 flowing in the supply channel 12 when stopped. In the embodiment, the cooling means 154 is a freezer, and its maximum capability is 6.2 kW. The heating means 155 heats the liquid 8 flowing in the supply channel 12 when driven, but does not heat the liquid 8 flowing in the supply channel 12 when stopped. In the embodiment, the heating means 155 is a heater, and its maximum capability is 12 kW. The temperature adjusting unit 15 cools the liquid 8 flowing in the supply channel 12 by the cooling means 154, and heats the liquid 8 flowing in the supply channel 12 by the heating means 155, to thereby adjust the temperature of the liquid 8 flowing in the supply channel 12 to the above-mentioned constant temperature.

The thermometer 16 is disposed in the circulation route 10, and measures the temperature of the liquid 8 and outputs the measurement result to the controller 40. In the embodiment, the thermometer 16 is disposed on the downstream side in the direction of flow of the liquid 8 in the supply channel 12 with respect to the temperature adjusting unit 15 in the supply channel 12 of the circulation route 10, and measures the temperature of the liquid 8 flowing in the supply channel 12 and outputs the measurement result to the controller 40.

The discharge route 20 has its one end connected to the other end of the supply channel 12 of the circulation route 10, has its other end connected to the outlet 5, and discharges the liquid 8 to the processing apparatus 100 via the outlet 5. The outflow quantity measuring section 30 measures the flow rate which is the outflow quantity of the liquid 8 through the outlet 5. In the embodiment, the outflow quantity measuring section 30 is disposed in the discharge route 20, and, by measuring the flow rate of the liquid 8 flowing in the discharge route 20, measures the flow rate of the liquid 8 flowing out via the outlet 5 to the processing apparatus 100, and outputs the measurement result to the controller 40.

The controller 40 controls each of the constituent units of the constant-temperature liquid supply apparatus 1. Specifically, the controller 40 controls the operations of at least the pump 13, the temperature adjusting unit 15, and the solenoid valve 17, to cause the constant-temperature liquid supply apparatus 1 to perform the operation of supplying the liquid 8 to the processing apparatus 100.

The controller 40 is a computer that includes an arithmetic processing device having a microprocessor such as a CPU, a storage device having a memory such as a ROM or a RAM, and an input/output interface device. The arithmetic processing device of the controller 40 carries out arithmetic processing according to a computer program stored in the storage device, and outputs control signals for controlling the constant-temperature liquid supply apparatus 1 to the above-mentioned constituent elements of the constant-temperature liquid supply apparatus 1 through the input/output interface device.

In addition, as depicted in FIG. 1, the controller 40 includes a timer 41, a first determination section 42, and a second determination section 43. The timer 41 measures time. The first determination section 42 determines switching from a normal mode of supplying the liquid 8 to the processing apparatus 100 to a stand-by mode of circulating the liquid 8 in the circulation route 10 by controlling the solenoid valve 17 when it is determined that the flow rate measured by the outflow quantity measuring section 30 is zero.

Note that the normal mode is an operation mode of the constant-temperature liquid supply apparatus 1 in which the controller 40 opens the outlet 5 by the outlet solenoid valve 7, drives the pump 13 to discharge the liquid 8 at a first flow rate from the tank 11 into the supply channel 12, drives the temperature adjusting unit 15 according to the result of measurement by the thermometer 16 to thereby adjust the temperature of the liquid 8 flowing in the supply channel 12 to the above-mentioned constant temperature, and closes the one branch channel 141 by the solenoid valve 17 to thereby supply the liquid 8 from the supply channel 12 to the processing apparatus 100 via the discharge route 20 and the outlet 5.

Note that, in this instance, the processing apparatus 100 has the above-mentioned on-off valve 103 being open. Note that, in the normal mode of the embodiment, the constant-temperature liquid supply apparatus 1 is operated such that the pump 13 discharges the liquid 8 into the supply channel 12 at the first flow rate of 25 L/min, and, for permitting the processing apparatus 100 to use the liquid 8 at 25 L/min, the liquid 8 is supplied in the order of the liquid supply source 2, the tank 11, the supply channel 12, and the processing apparatus 100, as indicated by bold-line arrows in FIG. 1.

The stand-by mode is an operation mode of the constant-temperature liquid supply apparatus 1 in which the solenoid valve 17 is opened, the pump 13 is controlled to set the discharge quantity of the liquid 8 from the pump 13 at the second flow rate lower than the first flow rate in the normal mode, the operation of the temperature adjusting unit 15 is stopped to thereby lower the power consumption of the pump 13 and the temperature adjusting unit 15 than that in the normal mode, and the liquid 8 is returned from the supply channel 12 to the tank 11 through the first branch channel 141 of the circulation channel 14.

Note that, in this instance, the processing apparatus 100 has the above-mentioned on-off valve 103 being closed. Note that, in the stand-by mode of the embodiment, the constant-temperature liquid supply apparatus 1 circulates the liquid 8 in the order of the tank 11, the supply channel 12, and the one branch channel 141 of the circulation channel 14, to thereby circulate the liquid 8 in the circulation route 10, as indicated by bold-line arrows in FIG. 3.

In addition, in the embodiment, the first determination section 42 determines switching from the normal mode to the stand-by mode by determining that the flow rate measured by the outflow quantity measuring section 30 is zero when the length of continuation time for which the flow rate is zero is measured by the timer and the thus measured continuation length of time exceeds a predetermined length of time.

The second determination section 43 determines to operate the temperature adjusting unit 15 by setting the discharge quantity from the pump 13 to the discharge quantity in the normal mode when the temperature of the liquid 8 measured by the thermometer 16 has exceeded a predetermined threshold. Note that the predetermined threshold means that the temperature of the liquid 8 is not lower than a predetermined lower limit temperature but is not higher than a predetermined upper limit temperature higher than the lower limit temperature, and the expression that the temperature of the liquid 8 has exceeded the predetermined threshold means that the temperature of the liquid 8 has become below the predetermined lower limit temperature or has exceeded the predetermined upper limit temperature. In the embodiment, the constant temperature of the liquid 8 is 25° C., the lower limit temperature of the predetermined threshold is 20° C., and the upper limit temperature of the predetermined threshold is 30° C. Note that the lower limit temperature of the predetermined threshold may be the same as or different from the lower limit temperature of the above-described constant-temperature liquid 8, and the upper limit temperature of the predetermined threshold may be the same as or different from the upper limit temperature of the above-described constant-temperature liquid 8.

Note that the functions of the timer 41, the first determination section 42, and the second determination section 43 may be realized by carrying out the arithmetic processing according to the computer program stored in the storage device by the arithmetic processing device of the controller 40, or may be realized by a dedicated processing circuit (hardware) such as a single circuit, a composite circuit, a programmed processor, or a parallel programmed processor.

Next, an operation of supplying the liquid 8 by the constant-temperature liquid supply apparatus 1 according to the embodiment will be described. FIG. 4 is a flow chart of an operation carried out repeatedly in the normal mode by the controller of the constant-temperature liquid supply apparatus depicted in FIG. 1. FIG. 5 is a flow chart of an operation carried out repeatedly in the stand-by mode by the controller of the constant-temperature liquid supply apparatus depicted in FIG. 1.

The constant-temperature liquid supply apparatus 1 opens the outlet solenoid valve 7, closes the solenoid valve 17, and drives the pump 13 and the temperature adjusting unit 15 to thereby supply the liquid 8 supplied from the liquid supply source 2 to the processing apparatus 100 during processing at the first flow rate, that is, in the normal mode, as depicted in FIG. 1. In the normal mode, the controller 40 repeatedly carries out the flow chart depicted in FIG. 4. In the normal mode, during processing by the processing apparatus 100, the processing apparatus 100 opens the on-off valve 103 to use the liquid 8, and the flow rate of the liquid 8 flowing in the discharge route 20, that is, the flow rate of the liquid 8 supplied through the outlet 5 to the processing apparatus 100, is equal to the flow rate of the liquid 8 used by the processing apparatus 100.

In the normal mode, the constant-temperature liquid supply apparatus 1 is operated such that the first determination section 42 of the controller 40 determines whether or not the flow rate of the liquid 8 flowing in the discharge route 20, that is, the flow rate of the liquid 8 supplied through the outlet 5 to the processing apparatus 100, is zero, in reference to the result of measurement by the outflow quantity measuring section 30, as depicted in FIG. 4 (step 401). In the normal mode, the constant-temperature liquid supply apparatus 1 repeats step 401 when the first determination section 42 of the controller 40 determines that the flow rate of the liquid 8 flowing in the discharge route 20, that is, the flow rate of the liquid 8 supplied through the outlet 5 to the processing apparatus 100 is not zero (step 401: No).

In the normal mode, when the processing apparatus 100 stops its operation such as grinding, the processing apparatus 100 stops using the liquid 8, and closes the on-off valve 103. In this case, the liquid 8 stays in the discharge route 20, and the flow of the liquid 8 in the discharge route 20 is stopped. Then, the constant-temperature liquid supply apparatus 1 is operated such that the first determination section 42 of the controller 40 determines that the flow rate of the liquid 8 flowing in the discharge route 20, that is, the flow rate of the liquid 8 supplied through the outlet 5 to the processing apparatus 100, is zero (step 401: Yes), the first determination section 42 of the controller 40 measures the length of continuation time for which the flow rate measured by the outflow quantity measuring section 30 is zero by the timer 41, and the first determination section 42 determines whether or not the length of continuation time has exceeded a predetermined length of time (step S402).

The constant-temperature liquid supply apparatus 1 returns to step 401 when the first determination section 42 of the controller 40 determines that the length of continuation time for which the flow rate measured by the outflow quantity measuring section 30 is zero has not exceeded the predetermined length of time (step 402: No). The constant-temperature liquid supply apparatus 1 transitions to the stand-by mode when the first determination section 42 of the controller 40 determines that the length of continuation time for which the flow rate measured by the outflow quantity measuring section 30 is zero has exceeded the predetermined length of time (step 402: Yes); in this instance, in the embodiment, the discharge quantity of the liquid 8 from the pump 13 is reduced as compared to the first flow rate and set at the second flow rate, the operation of the temperature adjusting unit 15 is stopped, and the solenoid valve 17 is opened (step 403).

In the stand-by mode, the controller 40 repetitively carries out the flow chart depicted in FIG. 5. In the stand-by mode, the constant-temperature liquid supply apparatus 1 is operated such that the first determination section 42 of the controller 40 determines whether or not the flow rate of the liquid 8 flowing in the discharge route 20, that is, the flow rate of the liquid 8 supplied through the outlet 5 to the processing apparatus 100, is zero, in reference to the result of measurement by the outflow quantity measuring section 30 (step 501), as depicted in FIG. 5. When the liquid 8 is supplied to the processing apparatus 100 through the discharge route 20 as a result of the processing apparatus 100 starting to use the liquid 8 again, for example, the first determination section 42 of the controller 40 determines that the flow rate of the liquid 8 flowing in the discharge route 20, that is, the flow rate of the liquid 8 supplied through the outlet 5 to the processing apparatus 100, is not zero (step 501: No), and the constant-temperature liquid supply apparatus 1 transitions to the normal mode. In the embodiment, the controller 40 increases the discharge quantity of the liquid 8 from the pump 13 as compared to the second flow rate to set the flow rate at the first flow rate, operates the temperature adjusting unit 15 (step 502), closes the solenoid valve 17 to transition to the normal mode, and returns to step 401.

The constant-temperature liquid supply apparatus 1 is operated such that, when the first determination section 42 of the controller 40 determines that the flow rate of the liquid 8 flowing in the discharge route 20, that is, the flow rate of the liquid 8 supplied through the outlet 5 to the processing apparatus 100, is zero (step 501: Yes), the second determination section 43 of the controller 40 determines whether or not the temperature measured by the thermometer 16 during the stand-by mode has exceeded a predetermined threshold (step 503). The constant-temperature liquid supply apparatus 1 returns to step 501 when the second determination section 43 of the controller 40 determines that the temperature measured by the thermometer 16 during the stand-by mode has not exceeded the predetermined threshold (step 503: No).

The constant-temperature liquid supply apparatus 1 is operated such that, when the second determination section 43 of the controller 40 determines that the temperature measured by the thermometer 16 during the stand-by mode has exceeded the predetermined threshold (step 503: Yes), the solenoid valve 17 is left open, the discharge quantity of the liquid 8 from the pump 13 is set to the first flow rate which is the discharge quantity in the normal mode, and the temperature adjusting unit 15 is operated (step 504).

As has been described above, the constant-temperature liquid supply apparatus 1 according to the embodiment is configured such that the controller 40 has the first determination section 42 which determines switching from the normal mode of supplying the liquid 8 to the processing apparatus 100 to the stand-by mode of controlling the solenoid valve 17 and circulating the liquid 8 in the circulation route 10, and that, in the stand-by mode, the discharge quantity from the pump 13 is reduced as compared to that in the normal mode and the operation of the temperature adjusting unit 15 is stopped, to thereby lower the power consumption of the pump 13 and the temperature adjusting unit 15.

As a result, the constant-temperature liquid supply apparatus 1 produces such an effect that power consumption can be suppressed by restraining the operations of the pump 13 and the temperature adjusting unit 15 when it is determined that the operation of the processing apparatus 100 is stopped. In the constant-temperature liquid supply apparatus 1 according to the embodiment, it has been clarified that, in the case where the maximum capability of the cooling means 154 is 6.2 kW and the maximum capability of the heating means 155 is 12 kW, when the pump 13 discharges the liquid 8 at the second flow rate and operations of both the cooling means 154 and the heating means 155 of the temperature adjusting unit 15 are stopped, the power consumption can be suppressed by approximately 37% (a reduction from 5,475 Wh to 2,073 Wh) as compared to the case where the pump 13 discharges the liquid 8 at the first flow rate and both the cooling means 154 and the heating means 155 of the temperature adjusting unit 15 are operated.

In addition, the constant-temperature liquid supply apparatus 1 according to the embodiment is able to restrain erroneous switching from the normal mode to the stand-by mode, since the first determination section 42 determines the switching from the normal mode to the stand-by mode by determining that the flow rate measured by the outflow quantity measuring section 30 is zero when the length of continuation time for which the flow rate is zero has exceeded a predetermined length of time.

Besides, the constant-temperature liquid supply apparatus 1 according to the embodiment has the second determination section 43 that determines to operate the temperature adjusting unit 15 by setting the discharge quantity from the pump 13 to the first flow rate which is the discharge quantity in the normal mode when the temperature measured by the thermometer 16 during the stand-by mode of the controller 40 has exceeded the predetermined threshold. Hence, the constant-temperature liquid supply apparatus 1 according to the embodiment is able to maintain the temperature of the liquid 8 supplied from the liquid supply source 2 at the predetermined threshold even in the stand-by mode, and is able to promptly supply the constant-temperature liquid 8 to the processing apparatus 100 upon transition to the normal mode.

In addition, the constant-temperature liquid supply apparatus 1 according to the embodiment is configured such that, in the normal mode, the flow rate of the liquid 8 discharged to the processing apparatus 100 may be greater than the amount of the liquid 8 used by the processing apparatus 100, as depicted in FIG. 6. Note that FIG. 6 is a diagram schematically depicting a case where the amount of the liquid 8 used by the processing apparatus 100 is smaller than the discharge quantity of the liquid 8 from the constant-temperature liquid supply apparatus 1 depicted in FIG. 1. Note that, in FIG. 6, the same parts as those in FIG. 1 above are denoted by the same reference characters as used above, and descriptions thereof are omitted.

Note that, in the case depicted in FIG. 6, the processing apparatus 100 uses the liquid 8 at a flow rate of 15 L/min, by opening the above-mentioned on-off valve 103. In this case, the constant-temperature liquid supply apparatus 1 is operated such that the pump 13 discharges the liquid 8 into the supply channel 12 at the first flow rate of 25 L/min, and the solenoid valve 17 is set closed. Hence, the constant-temperature liquid supply apparatus 1 is operated such that, as indicated by bold-line arrows in FIG. 6, part of the liquid 8 from the supply channel 12 is discharged through the discharge route 20 to the processing apparatus 100, while the relief valve 18 disposed in the other branch channel 142 of the circulation route 10 is opened by the pressure of the remaining part of the liquid 8 from the supply channel 12, and the remaining part of the liquid 8 is returned to the tank 11 via the circulation channel 14 and the other branch channel 142.

Note that the present invention is not to be limited to the above-described embodiment. In other words, various modifications can be made in carrying out the present invention within such ranges as not to depart from the gist of the invention. For example, in the present invention, transition to the stand-by mode may be made immediately upon determination by the first determination section 42 that the flow rate measured by the outflow quantity measuring section 30 is zero. In addition, in the present invention, in the stand-by mode, only a reduction of the discharge quantity from the pump 13 to the second flow rate lower than the first flow rate in the normal mode may be made, without stopping the operation of the temperature adjusting unit 15.

In addition, in the present invention, the processing apparatus 100 is not limited to the grinding apparatus that performs grinding while supplying the workpiece with the constant-temperature liquid 8 supplied from the constant-temperature liquid supply apparatus 1, and may be a cutting apparatus that performs cutting while supplying the workpiece with the constant-temperature liquid 8 supplied from the constant-temperature liquid supply apparatus 1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A constant-temperature liquid supply apparatus for supplying liquid from a liquid supply source to a processing apparatus while adjusting the liquid to a constant temperature, the constant-temperature liquid supply apparatus comprising:

a housing;

an inlet disposed in the housing such that the liquid is allowed to flow from the liquid supply source into the housing;

an outlet disposed in the housing such that the liquid is allowed to flow out of the housing to the processing machine;

a circulation route for circulating the liquid between the inlet and the outlet;

a tank that is disposed in the circulation route and accommodates the liquid flowing in through the inlet;

a pump that is disposed adjacent to the tank in the circulation route and discharges the liquid accommodated in the tank;

a temperature adjusting unit that is disposed in the circulation route and adjusts a temperature of the liquid;

an outflow quantity measuring section that measures an outflow quantity of the liquid flowing out through the outlet;

an on-off valve that is disposed in the circulation route and controls whether the liquid should be circulated in the circulation route; and a controller that controls at least the pump and the temperature adjusting unit, wherein the controller has a first determination section that determines switching from a normal mode of supplying the liquid to the processing apparatus to a stand-by mode of circulating the liquid in the circulation route by controlling the on-off valve, when it is determined that the outflow quantity of the liquid measured by the outflow quantity measuring section is zero, and, in the stand-by mode, the discharge quantity from the pump is set to be smaller than that in the normal mode to thereby lower the power consumption of the pump.

2. The constant-temperature liquid supply apparatus according to claim 1, wherein the controller stops operation of the temperature adjusting unit to thereby lower the power consumption of the temperature adjusting unit, in the stand-by mode.

3. The constant-temperature liquid supply apparatus according to claim 2, further comprising:

a thermometer that is disposed on a downstream side of the temperature adjusting unit and measures the temperature of the liquid, wherein the controller has a second determination section that determines to switch the discharge quantity from the pump to a discharge quantity in the normal mode and operate the temperature adjusting unit, when the temperature measured by the thermometer exceeds a predetermined temperature during the stand-by mode.

4. The constant-temperature liquid supply apparatus according to claim 1, wherein the controller has a timer, and the first determination section measures a length of continuation time for which the outflow quantity of the liquid measured by the outflow quantity measuring section is zero by the timer, and, when the length of continuation time exceeds a predetermined length of time, the first determination section determines that the outflow quantity of the liquid is zero, and the controller switches from the normal mode to the stand-by mode.

* * * * *